United States Patent
Xu

(10) Patent No.: US 8,386,827 B2
(45) Date of Patent: Feb. 26, 2013

(54) SYSTEMS AND METHODS FOR SIGNAL DELAY AND ALIGNMENT

(75) Inventor: Changyou Xu, Fremont, CA (US)

(73) Assignee: LSI Corporation, San Jose, CA (US)

( * ) Notice: Subject to any disclaimer, the term of this patent is extended or adjusted under 35 U.S.C. 154(b) by 961 days.

(21) Appl. No.: 12/463,585

(22) Filed: May 11, 2009

(65) Prior Publication Data

US 2010/0284508 A1    Nov. 11, 2010

(51) Int. Cl.
G06F 1/12    (2006.01)
(52) U.S. Cl. ........................................ 713/400
(58) Field of Classification Search .................... 713/400
See application file for complete search history.

(56) References Cited

U.S. PATENT DOCUMENTS

| | | | |
|---|---|---|---|
| 6,219,689 B1* | 4/2001 | Mori | 718/101 |
| 7,039,836 B2* | 5/2006 | Powers et al. | 714/48 |
| 2006/0218124 A1* | 9/2006 | Williamson et al. | 707/2 |

* cited by examiner

*Primary Examiner* — Kim Huynh
*Assistant Examiner* — Eric Chang
(74) *Attorney, Agent, or Firm* — Hamilton DeSanctis & Cha

(57) ABSTRACT

Various embodiments of the present invention provide systems and methods for event alignment control. For example, an event alignment control circuit is disclosed that includes a delay table, a flag write controller circuit, and a signal reconstruction circuit. The delay table includes at least a first register and a last register, and is operable to transfer data from the first register to the last register. The flag write controller circuit is operable to receive an indication of assertion of an event flag and to write information relevant to the event flag to the first register of the delay table. The signal reconstruction circuit is electrically coupled to the last register, and reconstructs the event flag based at least in part on the information relevant to the event flag obtained from the last register.

24 Claims, 8 Drawing Sheets

SYSTEMS AND METHODS FOR SIGNAL DELAY AND ALIGNMENT

BACKGROUND OF THE INVENTION

The present inventions are related to systems and methods for processing data, and more particularly to systems and methods for aligning processing events.

Data processing is often impacted by one or more ongoing events. In such cases, a signal indicating the occurrence of a given event is provided to a processing circuit. Where the output of the processing circuit is further processed by another downstream processing circuit, the same event may affect processing of the downstream processing circuit. Where this is the case, the signal indicating the event is fed forward to the downstream processing circuit. This generally requires that the signal indicating the event be delayed in time to align it with the operation in the downstream processing circuit. Delaying the signal is typically accomplished by clocking the signal through a series of flip-flops, where the number of flip-flops corresponds to the number of clock cycles of delay that is desired. This works reasonably well when the delay is relatively small. Where the delay gets large, however, it can require thousands of flip-flops which may be prohibitive.

Hence, for at least the aforementioned reasons, there exists a need in the art for advanced systems and methods for aligning signals in time.

BRIEF SUMMARY OF THE INVENTION

The present inventions are related to systems and methods for processing data, and more particularly to systems and methods for aligning processing events.

Various embodiments of the present invention provide event alignment control circuits. Such circuits include a delay table, a flag write controller circuit, and a signal reconstruction circuit. The delay table includes at least a first register and a last register, and is operable to transfer data from the first register to the last register. The flag write controller circuit is operable to receive an indication of assertion of an event flag and to write information relevant to the event flag to the first register of the delay table. The signal reconstruction circuit is electrically coupled to the last register, and reconstructs the event flag based at least in part on the information relevant to the event flag obtained from the last register. In some cases, the information relevant to the event flag includes: a start value that indicates a location of the event flag relevant to a particular occurrence; and a length value that indicates a period of time that the event flag is asserted. In various cases, the particular occurrence is an end or start of codeword indicator signal.

In some instances of the aforementioned embodiments of the present invention, the first register and the last register are arranged in a shift register architecture with an output of the first register being applied to a second register, and the output of the second register ultimately being applied to the last register via one or more intervening registers. In some such instances, the delay table includes a shift controller circuit operable to shift information from the first register toward the last register such that no unused register remains between the register that receives the information derived from the first register and the last register.

In various instances of the aforementioned embodiments of the present invention, the event flag is a media defect flag, while in other instances, the event flag is a thermal affinity flag. In one or more instances of the aforementioned embodiments of the present invention, the circuit further includes a first processing circuit and a second processing circuit. In such instances, the event flag is relevant to a defined portion of data being processed by the first processing circuit, and the reconstructed event flag is relevant to a defined portion of the data being processed by the second processing circuit. In some cases, the first processing circuit includes a first data detector circuit, the second processing circuit includes a second data detector circuit, and the data processed by the second processing circuit is derived from an output of the first processing circuit. In other cases, the first processing circuit includes a data detector circuit, the second processing circuit includes a data decoder circuit, and the data processed by the decoder circuit is derived from an output of the data detector circuit.

Other embodiments of the present invention provide methods for aligning events across multiple processes. Such methods include, providing a delay table that has a first register and a last register. An event flag is received and information relevant to the event flag is identified. The information relevant to the event flag is written to the first register of the delay table, and is shifted from the first register to the last register. The information relevant to the event flag is accessed from the last register, and based at least in part on the information relevant to the event flag, reconstructing the event flag to provide a reconstructed flag at a defined point in the future.

Yet other embodiments of the present invention provide event alignment control circuits. Such circuits include a first delay table and a second delay table, a flag write controller circuit, and a first signal reconstruction circuit and a second signal reconstruction circuit. The first delay table includes at least a first register and a last register, and is operable to transfer data from the first register to the last register. The flag write controller circuit is operable to receive an indication of assertion of an event flag and to write information relevant to the event flag to the first register of the first delay table. The information relevant to the event flag includes: a start value that indicates a location of the event flag relevant to a particular occurrence; and a length value that indicates a period of time that the event flag is asserted. The first signal reconstruction circuit is electrically coupled to the last register of the first delay table, and reconstructs the event flag based at least in part on the information relevant to the event flag obtained from the last register of the first delay table. The second delay table includes at least a first register and a last register, and is operable to transfer data from the first register to the last register. The first register of the second delay table is operable to receive the contents of the last register of the first delay table. The second signal reconstruction circuit is electrically coupled to the last register of the second delay table, and reconstructs the event flag based at least in part on the information relevant to the event flag obtained from the last register of the second delay table.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some

FIG. 3b is a timing diagram depicting an exemplary operation of the single event alignment control circuit of FIG. 3a;

FIG. 4b is a timing diagram depicting an exemplary operation of the multiple stage event alignment control circuit of FIG. 4a;

DETAILED DESCRIPTION OF THE INVENTION

The present inventions are related to systems and methods for processing data, and more particularly to systems and methods for aligning processing events.

Figure 1:
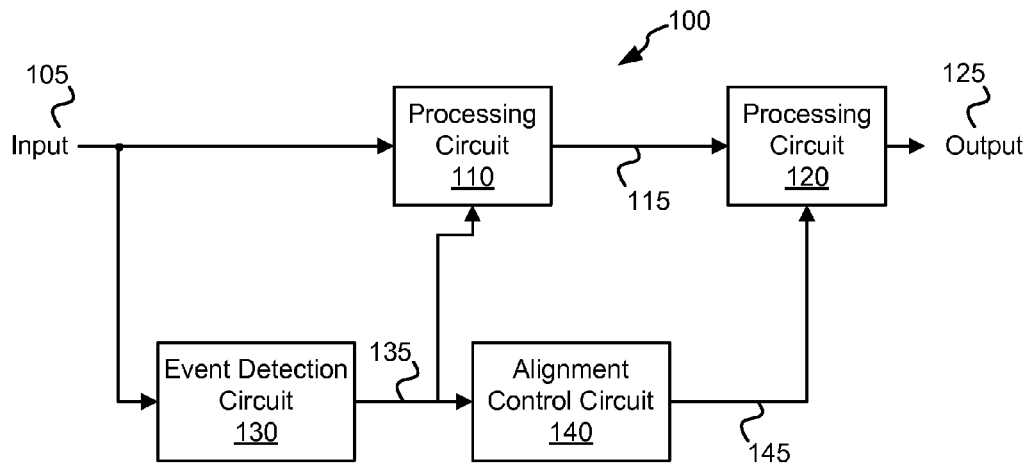
FIG. 1 depicts a processing system with event alignment control in accordance with one or more embodiments of the present invention.

Turning to FIG. 1, a processing system 100 including event alignment control is shown in accordance with one or more embodiments of the present invention. Processing system 100 includes a first stage processing circuit 110 and a second stage processing circuit 120. First stage processing circuit 110 receives an input 105 and performs some level of processing on the received input. The processed input is then provided as an input 115 to second stage processing circuit 120. Second stage processing circuit 120 performs some level of processing on input 115 and provides the processed result as an output 125. First stage processing circuit 110 and second stage processing circuit 120 may be any processing circuits known in the art that are capable of processing a data input, and providing a data output.

The operation of first stage processing circuit 110 is at least in part controlled by an event input 135, and the operation of second stage processing circuit 120 is at least in part controlled by an event input 145. Event input 135 and event input 145 may be any signal that affects the processing of first stage processing circuit 110 and/or second stage processing circuit 120. Event input 135 and event input 145 may be derived from processing input 105 or from another source. For example, event input 135 and event input 145 may be derived from an external source that is asynchronous to first stage processing circuit 110 and second stage processing circuit 120. In other cases, as discussed below, event input 135 and event input 145 are derived from input 105.

An event detection circuit 130 receives input 105 and determines whether one or more events relevant to processing have occurred. In particular, event detection circuit 130 identifies an event that is applicable to the processing of input 105 by first stage processing circuit 110, and provides an indication of the identified event as event input 135. Event input 135 is also provided to an alignment control circuit 140. Where event input 135 is also relevant to second stage processing circuit 120, alignment control circuit 140 delays event input 135 in time to provide event input 145 to second stage processing circuit 120 such that it is aligned in time with the portion of input 115 that corresponds to event input 135. As such, alignment control circuit 140 reconstructs event input 135 at a future time that corresponds to an identifiable processing stage of processing circuit 120.

Figure 2:
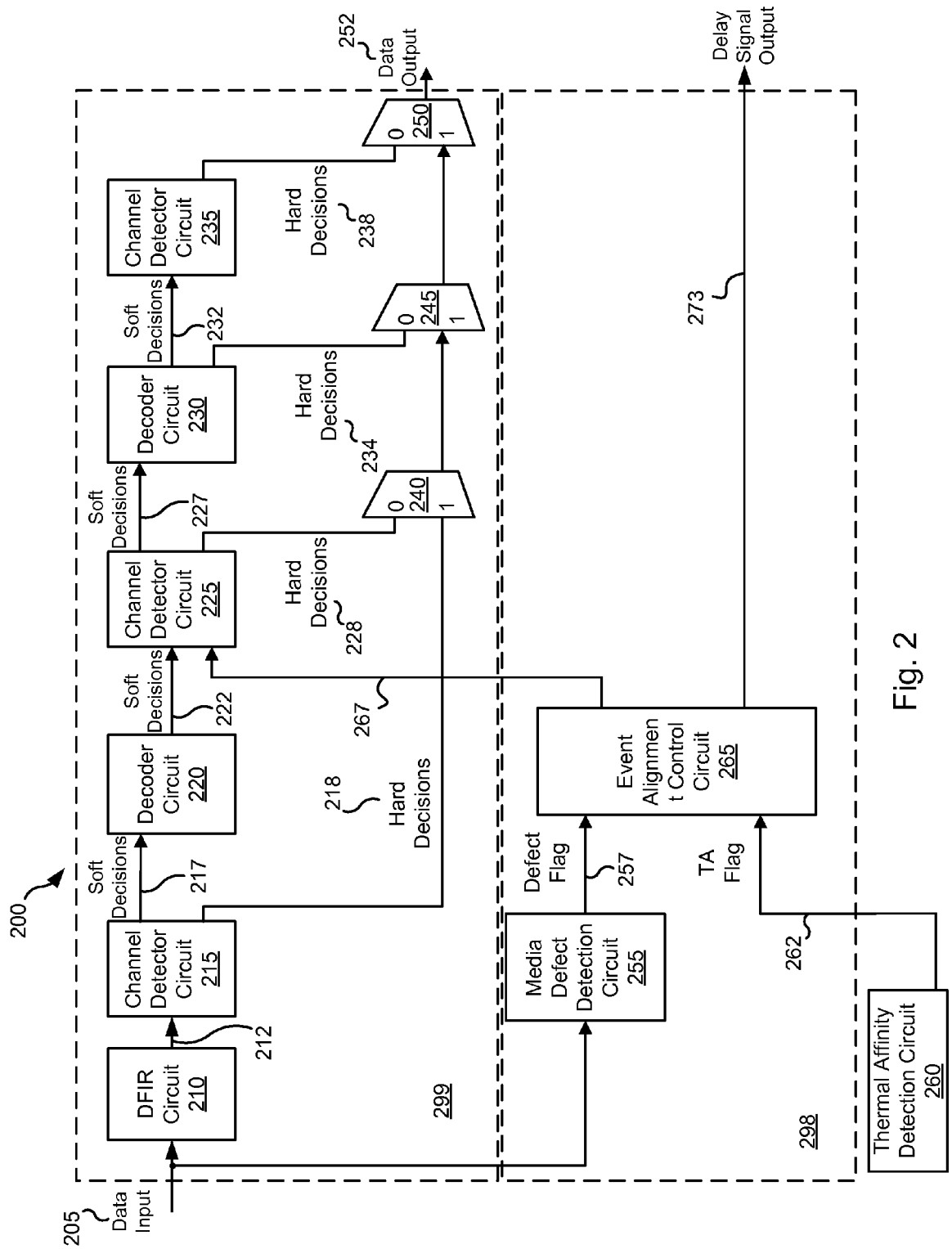
FIG. 2 depicts a data processing circuit including event alignment control in accordance with one or more embodiments of the present invention.

Turning to FIG. 2, a multistage data processing circuit 200 including event alignment control is depicted in accordance with one or more embodiments of the present invention. Multistage data processing circuit 200 includes a data processing circuit 299 (outlined with a dashed line), and an event alignment circuit 298 (outlined in dashed lines). Data processing circuit 299 includes a series of data decoder circuits and channel detector circuits that provide multiple processing stages. In particular, data processing circuit 299 includes a digital finite impulse response filter (DFIR) 210 that receives an input 205 and provides a filtered output 212. Filtered output 212 is provided to a channel detector circuit 215 that processes the input and yields both soft decisions 217 and hard decisions 218. Channel detector circuit 215 may be any channel detector circuit known in the art. In some embodiments of the present invention, channel detector circuit 215 is a maximum a priori (MAP) detector circuit as are known in the art. Based upon the disclosure provided herein, one of ordinary skill in the art will recognize a variety of detector circuits that may be used in relation to different embodiments of the present invention.

Soft decisions 217 are provided to decoder circuit 220, and hard decisions 218 are provided to a multiplexer 240. As is known in the art, soft decisions 217 provide reliability information for the corresponding bits of hard decisions 218. Decoder circuit 217 applies a decoding algorithm to soft decisions 217 and provides resulting soft decisions 222 to another channel detector circuit 225. Decoder circuit 220 may be any decoder circuit known in the art. In some embodiments of the present invention, decoder circuit 220 is a low density parity check (LDPC) decoder circuit as are known in the art. Based upon the disclosure provided herein, one of ordinary skill in the art will recognize a variety of decoder circuits that may be used in relation to different embodiments of the present invention.

Channel detector circuit 225 provides soft decisions 227 and hard decisions 228. Channel detector circuit 225 may be any channel detector circuit known in the art. In some embodiments of the present invention, channel detector circuit 225 is a maximum a priori (MAP) detector circuit as are known in the art. Based upon the disclosure provided herein, one of ordinary skill in the art will recognize a variety of detector circuits that may be used in relation to different embodiments of the present invention.

Soft decisions 227 are provided to a decoder circuit 230, and hard decision data 228 is provided to multiplexer 240. As is known in the art, soft decisions 227 provide reliability information for the corresponding bits of hard decisions 228. Decoder circuit 230 applies a decoding algorithm to soft decisions 227 and provides resulting soft decisions 232 to another channel detector circuit 235. Decoder circuit 230 may be any decoder circuit known in the art. In some embodiments of the present invention, decoder circuit 230 is a low density parity check (LDPC) decoder circuit as are known in the art. Based upon the disclosure provided herein, one of ordinary skill in the art will recognize a variety of decoder circuits that may be used in relation to different embodiments of the present invention.

Decoder circuit 230 provides soft decisions 232 and hard decisions 234. As is known in the art, soft decisions 232 provide reliability information for the corresponding bits of hard decisions 234. Hard decisions 234 are provided to a multiplexer 245. An output 242 of multiplexer 240 is provided as an input to multiplexer 245. Soft decisions 232 are provided to a channel detector circuit 235. Channel detector circuit 235 provides hard decisions 238. Channel detector circuit 235 may be any channel detector circuit known in the art. In some embodiments of the present invention, channel detector circuit 235 is a maximum a priori (MAP) detector circuit as are known in the art. Based upon the disclosure provided herein, one of ordinary skill in the art will recognize a variety of detector circuits that may be used in relation to different embodiments of the present invention. Hard decisions 238 are provided to a multiplexer 250. An output 247 of multiplexer 245 is provided as an input to multiplexer 250. The output of multiplexer 250 is provided as a data output 252.

As shown, data processing circuit 299 provides a series of processing stages that are each affected by the same determinations of thermal affinity and/or media defects. For example, where data input 205 is derived from a defective region of a medium, that defective region may be detected using a media defect detection circuit 255. Where such a media defect is detected, it may be used to apply erasure decoding in any one of the downstream data processors, except that the defect signal needs to be moved forward in time to align it with the data being processed. Event alignment circuit 298 provides for detecting and/or receiving event signals, and aligning such signals with the operations of data processing circuit 299.

Event alignment circuit 298 includes a media defect detection circuit 255. A thermal affinity detection circuit 260 is also provided in the analog domain. Media defect detection circuit 255 may be any circuit known in the art that is capable of identifying a region on a medium that is defective. As an example, a media defect detector is used that is similar to that disclosed in U.S. patent application Ser. No. 12/111,255 entitled "Systems and Methods for Media Defect Detection Utilizing Correlated DFIR and LLR Data", and filed Apr. 29, 2008 by Tan et al. The entirety of the aforementioned reference is incorporated herein by reference for all purposes. Based upon the disclosure provided herein, one of ordinary skill in the art will recognize a variety of media defect detection circuits and/or methods that may be used in relation to different embodiments of the present invention. Media defect detection circuit 255 receives data input 205, and based upon data input 205 identifies one or more regions on the medium from which data input 205 is derived that are defective. When a defective region is identified, a defect flag 257 is asserted. Thermal affinity detection circuit 260 identifies any thermal affinity in the circuit as is known in the art. When a thermal affinity is identified, a thermal affinity flag 262 is asserted. Based upon the disclosure provided herein, one of ordinary skill in the art will recognize a variety of thermal affinity detection circuits that may be used in relation to different embodiments of the present invention.

Defect flag 257 and thermal affinity flag 262 are provided to event alignment control circuit 265. Event alignment and control circuit 265 provides one or more of defect flag 257 and thermal affinity flag 262 to different stages of data processing circuit 299, with each of the provided signals being time aligned with the particular stage of data processing circuit 299. In particular, event alignment and control circuit 265 provides one or more of defect flag 257 and thermal affinity flag 262 as a control input 267 to channel detector circuit 225, and as a control input 271 to a subsequent processing circuit allowing for use of the delayed signal in relation to further processing. Control input 267 may be used, for example, as an erasure flag. Multiplexers 240, 245, 250 may be selected by a programmable mode register (not shown).

Figure 3A:
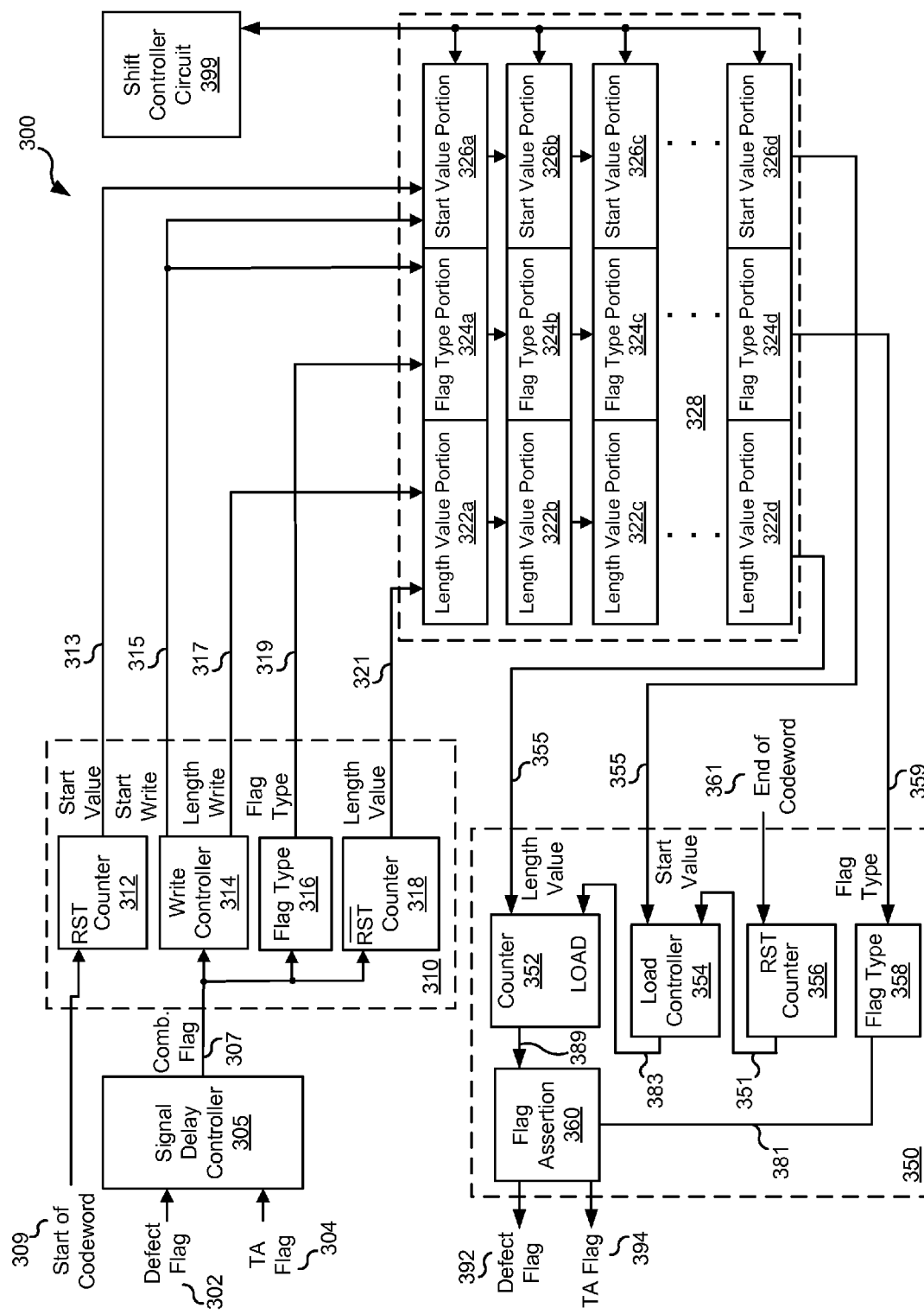
FIG. 3a shows a single stage event alignment control circuit in accordance with one or more embodiments of the present invention.

Turning to FIG. 3a, a single stage event alignment control circuit 300 is shown in accordance with one or more embodiments of the present invention. Single stage event alignment control circuit 300 may be used in place of event alignment control circuit 265 to provide one or more of control inputs 267, 269, 271. Single stage event alignment control circuit 300 is capable of receiving one or more event signals, and for time shifting the one or more event signals into the future for use in relation to a later processing step. It should be noted that while single stage event alignment control circuit 300 is described in relation to shifting forward signals often found (i.e., defect flag 302 and thermal affinity flag 304) in storage applications, that a similar circuit may be used to shift forward signals in a number of different circuits. Based upon the disclosure provided herein, one of ordinary skill in the art will recognize a variety of circuits to which single stage event alignment control circuit 300 may be applied.

Single stage event alignment control circuit 300 includes a signal delay controller circuit 305 that receives a defect flag 302 and a thermal affinity flag 304. Signal delay controller circuit 305 provides a combination flag 307. Combination flag 307 is asserted whenever either of defect flag 302 or thermal affinity flag 304 are asserted. Combination flag 307 is provided to a flag write controller circuit 310 (shown in dashed lines). Flag write controller circuit 310 writes a flag information set to a delay table 328. Flag write controller circuit 310 includes a start value counter 312, a write controller circuit 314, a flag type writing circuit 316 and a length counter 318.

Start value counter 312 counts bits in a codeword being processed. As such, start value counter 318 is reset whenever a start of codeword is identified, and is incremented each time another bit of a codeword is received (e.g., via input 205). The value at the output of start value counter 312 represents the bit number of the codeword corresponding to the start of the assertion of combination flag 307. This bit number is referred to as a start value 313 that is written to delay table 328.

Flag type writing circuit 316 prepares a flag type signal 319 that is to be written to delay table 328. For example, where combination flag 307 is asserted because media defect flag 302 was asserted, a message indicating a media defect is provided as flag type 319. As another example, where combination flag 307 is asserted because thermal affinity flag 304 was asserted, a message indicating a thermal affinity defect is provided as flag type 319.

Length counter 318 provides an indication of the length for which combination flag 307 was asserted. As shown, when combination flag 307 is de-asserted, length counter 318 is reset. While combination flag 307 is asserted, length counter 318 is incremented for each clock period that combination flag 307 is asserted. Thus, at the end of assertion of combination flag 307, the value on length counter 318 represents the duration of assertion of combination flag 307. The value of length counter 318 is provided as a length value 321 to be written to delay table 328.

Write controller circuit 314 provides a start write signal 315 to delay table 328 upon initial assertion of combination flag 307, and also asserts a length write signal 317 upon initial de-assertion of combination flag 307. Upon assertion of start write signal 315, start value 313 is written to a start value portion 326 of a first buffer in delay table 328. In addition, upon assertion of start write signal 315, flag type 319 is written to a flag type portion 324 of the first buffer in delay table 328. Upon assertion of length write signal 317, length value 321 is written to a length value portion 322 of the first register in delay table 328. As such, each time an event flag is asserted (e.g., defect flag 302 or thermal affinity flag 304) and subsequently de-asserted, vital information about that event flag is recorded in the first register of delay table 328. This information includes the starting point (i.e., start value 313) at which the flag is initially asserted, the type of flag (i.e., flag type 319) that was asserted, and the duration of the assertion (i.e., length value 321). This information may be used by a signal reconstruction circuit 350 to re-assert the same flag aligned with future data processing.

Delay table 328 includes a number of registers (e.g., individual registers are identified in FIG. 3 by lower case letters a, b, c and d) similar to the first register. The registers may be arranged using a shift register architecture where bits from the first register are provided as inputs to corresponding bits of the next register, with this arrangement continuing down to the last register. Thus, the output of length value portion 322a of the first register is provided as an input to the length value portion 322b of the next register, the output of flag type portion 324a of the first register is provided as an input to flag type portion 324b of the next register, and the output of start value portion 326a of the first register is provided as an input to start value portion 326b of the next register. This continues from the register marked with (b) to the register marked with (c), and ultimately to the last register marked with (d). This shift register architecture allows the data in the first register to be shifted to the next register, and ultimately to the last register in delay table 328. By arranging delay table 328 this way, a first in, first out operation can be implemented where signal reconstruction circuit 350 only needs to consider the contents of the last register in determining the timing for reconstructing event signals. To assure that the last register always includes information about the next event signal to be reconstructed, a shift controller circuit 399 causes data from the first register to bubbled down to the unused register that is most proximate to the last register. To do this, after data is written to the first register (i.e., the register marked with (a)), it is determined if the next register (i.e., the register marked with (b)) is unused. An unused register may be determined using any number of mechanisms. For example, once the contents of the register are moved to another register, the flag type portion 324 of the register from which the contents are moved may be written with all zeros indicating the register is unused. Based on the disclosure provided herein, one of ordinary skill in the art will recognize a variety of other approaches for identifying registers as unused. Where the next register is determined to be unused, the information from the first register is transferred to the next register, and the first register is marked as unused. The information in the recently written next register may be transferred to the next register in the sequence where it is unused. This process continues until the registers nearest to the last register are all used, and only registered in sequence from the first register are unused.

Signal reconstruction circuit 350 is directly connected to the last register in delay table 328. Signal reconstruction circuit 350 uses the information available from the last register to determine when to reconstruct the signal represented by the information in the last register. In particular, signal reconstruction circuit 350 includes a length counter 352, a load controller circuit 354, a location counter 356, a flag type circuit 358, and a flag assertion circuit 360. Signal reconstruction circuit 350 asserts one or both of a defect flag 392 and a thermal affinity flag 394 at the appropriate time in the future and for the appropriate duration to reconstruct defect flag 302 and thermal affinity flag 304.

Flag type circuit 358 identifies the type of flag to be asserted based upon flag type portion 324d of the last register. Thus, where the flag type that caused the contents of the last register to be originally written was a defect flag, flag type 359 will indicate a defect flag, and flag type circuit 358 will provide this indication to flag assertion circuit 360 as an output 381. Alternatively, where the flag type that caused the contents of the last register to be originally written was a thermal affinity flag, flag type 359 will indicate a thermal affinity flag, and flag type circuit 358 will provide this indication to flag assertion circuit 360 as output 381.

Similar to start value counter 312, location counter 356 is reset at the start of a codeword as indicated by an input 361. The count value is then incremented as each bit of the succeeding codeword is received and processed. As such, a count value 351 on location counter provides an indication of the current processing location within the ongoing codeword. Count value 351 is provided to load controller circuit 354 that compares count value 351 with a start value 355 obtained from start value portion 326d of the last register. Where the comparison indicates that the same codeword location exists (i.e., start value 355 equals or is almost equal to count value 351), a load signal 383 is asserted. Upon assertion of load signal 383, length value 353 is written to length counter 352. When the value of length counter 352 is non-zero, flag assertion circuit 360 asserts the flag indicated by output 381 (i.e., one or both of defect flag 392 and thermal affinity flag 394). Length counter 352 is decremented as each bit of the codeword is received and processed by the second processing stage. The flag(s) asserted by flag assertion circuit 360 remain asserted until the value of length counter reaches zero.

Once the values from the last register in delay table 328 have been used by signal reconstruction circuit 350, the contents of all registers in delay table 328 are shifted to the respective next register (i.e., the contents of the first register are shifted to the second register, the contents of the second register are shifted to the third register, ... the contents of the second to last register are shifted to the last register). In this way, the last register in delay table 328 includes information related to the next event flag that is to be reconstructed. By arranging delay table 328 this way, routing requirements are limited as signal reconstruction circuit 350 is only ever concerned with the contents of the last register in delay table 328.

Figure 3B:
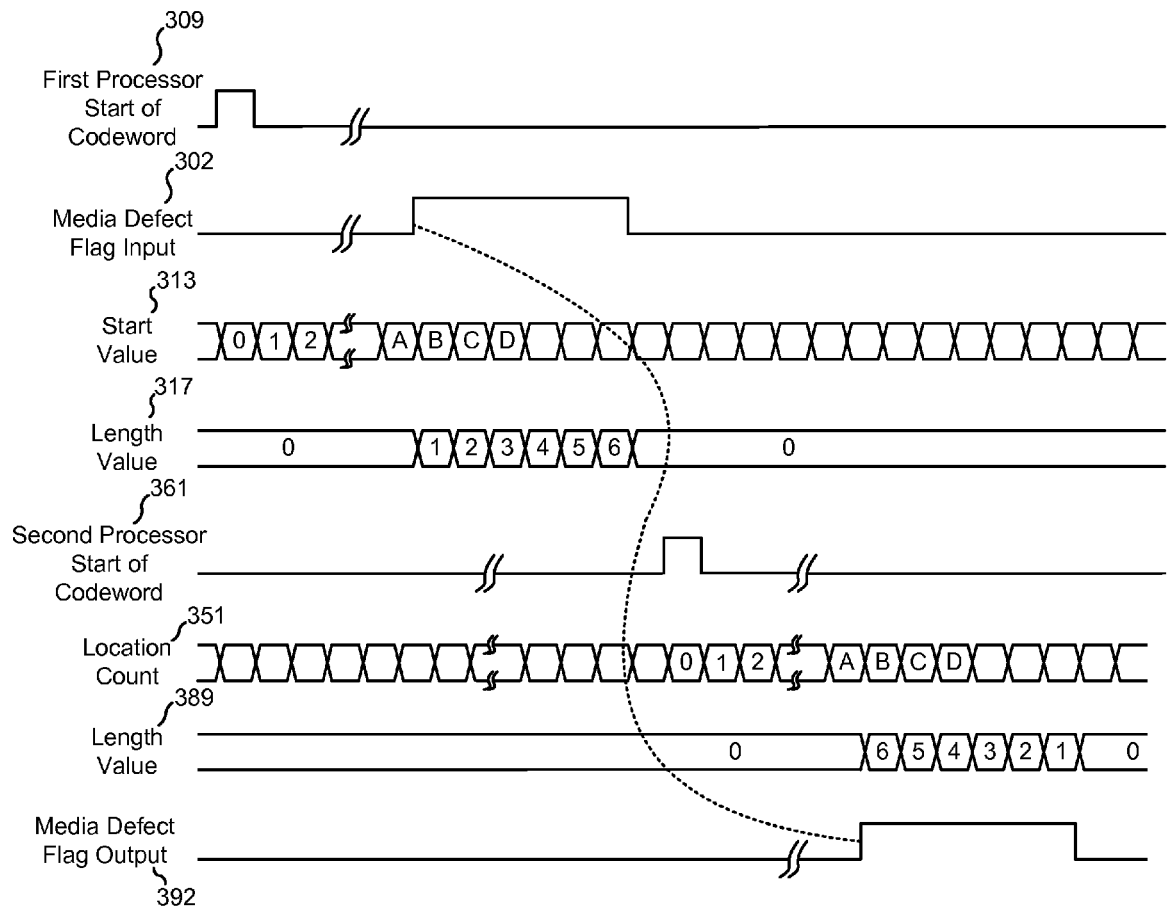

Turning to FIG. 3b, a timing diagram 301 depicts an exemplary operation of single event alignment control circuit 300 described above in relation to FIG. 3a. Following timing diagram 301, a start of codeword signal 309 available from a first processing stage is shown. When start of codeword signal 309 is asserted, start value counter 312 is reset causing start value 313 to go to zero. As each bit period is processed by the first processing stage, start value 313 is incremented. At a point where start value 313 is an 'B' a media defect is indicated by assertion of media defect flag 302. Upon assertion of media defect flag 302, the current value of start value 313 (i.e., 'B') is loaded to start value portion 326a and a media defect flag type indicator 319 is loaded to flag type portion 324a of the first register in delay table 328. While media defect flag 302 is asserted, length counter 318 is incremented resulting in incrementing of length value 317. When media defect flag 302 is de-asserted, the current value of length counter 318 (i.e., 6) is loaded to length value portion 322a of the first register in delay table 328.

At this juncture, a complete information set about an event has been gathered and is stored in the first register of delay table 328. The information in the first register is shifted to later registers in delay table 328 such that there are no unused registers (bubbles) between the last register (i.e., the register marked with a d) in delay table 328 and the register that holds the information about the most recent event. As signal reconstruction circuit 350 accesses information from the last register in delay table 328, and progressively moves the information from earlier registers into the last register for use, the information for the most recently identified event flag is eventually moved into the last register where it is accessible to signal reconstruction circuit 350.

A start of codeword signal 361 available from a second processing stage is shown. This start of codeword signal may be used to synchronize media defect flag input 302 provided to the first processing stage with the processing ongoing in the second processing stage. This synchronous point may be several thousand clock cycles later. By using the methods discussed herein for synchronizing event flags, an event flag may be moved into future by a large number of clock cycles without requiring that delay register have a number of register stages corresponding to the number of clock cycles. This results in a reduction in power and gates expended in synchronizing event flags between successive processing circuits. Based upon the disclosure provided herein, one of ordinary skill in the art will recognize a variety of other advantages that may be had through implementation of different embodiments of the present invention.

Upon assertion of start of codeword signal 361, location counter 356 is reset and is incremented for each successive bit period thereafter. This causes location count 351 to increment. When location count 351 is equivalent to the value maintained in start value portion 326d of the last register, media defect flag 392 is asserted. The assertion of media defect flag 392 occurs the same distance from start of codeword signal 361 as media defect flag 302 occurs from start of codeword signal 309. Thus, the assertion point of media defect flag 392 is reconstructed to represent media defect flag 302 shifted forward a number of clock cycles. At the same time that media defect flag 392 is asserted, a length counter is loaded with the length information from length value portion 322d of the last register of delay table 328. The length counter is decremented on each successive bit period, and as the length value transitions to zero, media defect flag 392 is de-asserted. In this way, the length between the de-assertion point of media defect flag 392 and the assertion point of media defect flag 392 is the same as the length between the de-assertion point of media defect flag 302 and the assertion point of media defect flag 302. Once media defect flag 392 is de-asserted, the information in the last register of delay table 328 is replaced by the next higher register, and all other registers are moved down in preparation for reconstruction of the next event flag.

Figure 4A:
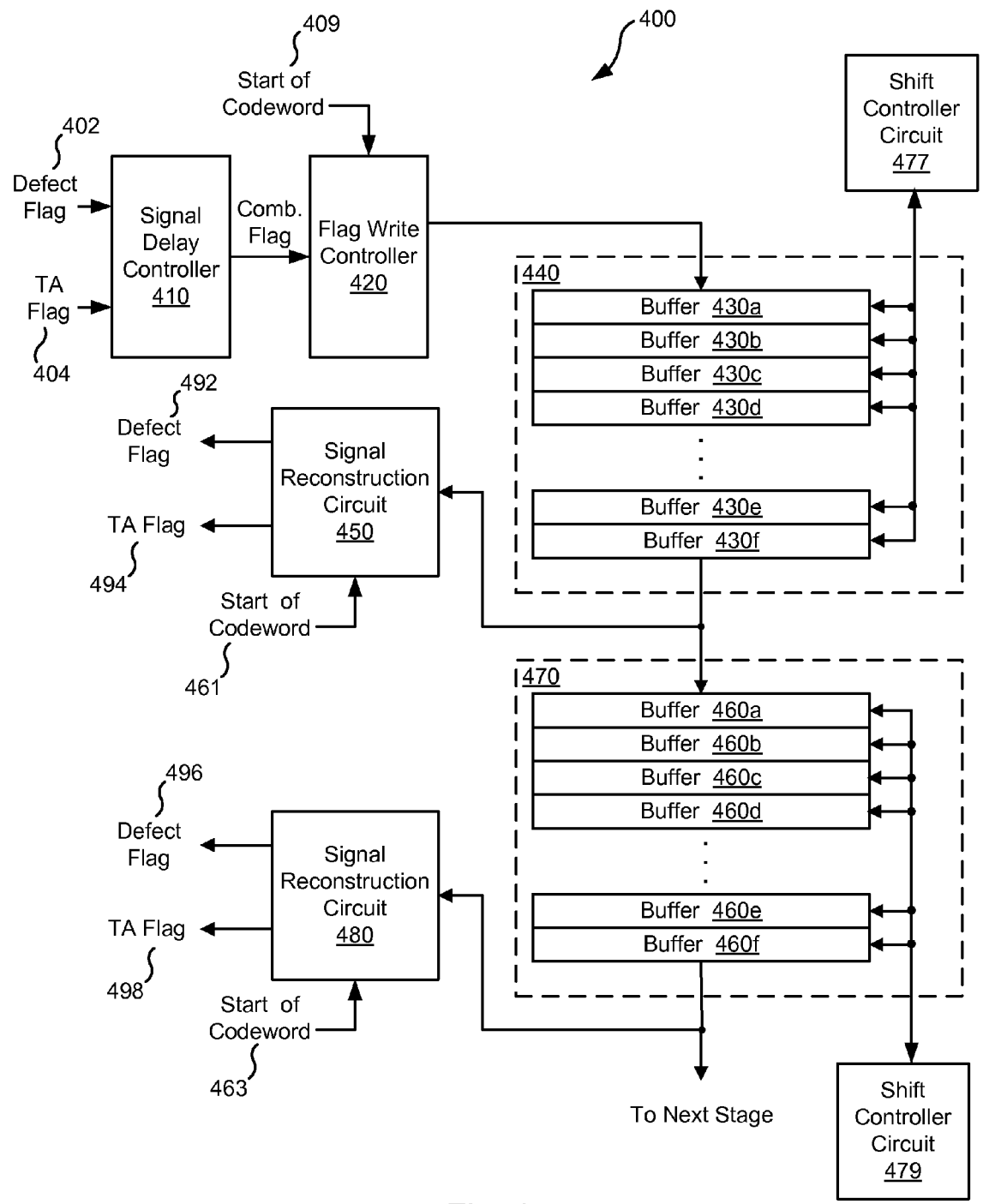
FIG. 4a shows a multiple stage event alignment control circuit in accordance with one or more embodiments of the present invention.

Turning to FIG. 4a, a multiple stage event alignment control circuit 400 is shown in accordance with one or more embodiments of the present invention. Multiple stage event alignment control circuit 400 may be used in place of event alignment control circuit 265 to provide one or more of control inputs 267, 269, 271. Multiple stage event alignment control circuit 400 is capable of receiving one or more event signals, and for time shifting the one or more event signals into the future for use in relation to a later processing step. It should be noted that while single stage event alignment control circuit 400 is described in relation to shifting forward signals often found (i.e., defect flag 402 and thermal affinity flag 404) in storage applications, that a similar circuit may be used to shift forward signals in a number of different circuits. Based upon the disclosure provided herein, one of ordinary skill in the art will recognize a variety of circuits to which single stage event alignment control circuit 400 may be applied.

Multiple stage event alignment control circuit 400 includes a signal delay controller circuit 410 that receives a defect flag 402 and a thermal affinity flag 404. Signal delay controller circuit 405 provides a combination flag 407. Combination flag 407 is asserted whenever either of defect flag 402 or thermal affinity flag 404 are asserted. Combination flag 407 is provided to a flag write controller circuit 420. Based upon combination flag 407, flag write controller circuit 420 prepares an information set identifying relevant characteristics of the received event flag. As an example, the relevant characteristics may include, but are not limited to, a start point of the asserted flag relative to a start of codeword signal 409, the type of event flag asserted, and a duration of the asserted event flag. This information set is written by flag write controller circuit 420 to a first register (i.e., buffer 430a) in a first storage delay table. Based upon the disclosure provided herein, one of ordinary skill in the art will recognize a variety of information relevant to the assertion of an event flag that may be gathered by flag write controller circuit 420 and written to first stage delay table 440. In some cases, flag write controller circuit 420 is implemented similar to flag write controller circuit 310 described above in relation to FIG. 3.

First stage delay table 440 includes a number of registers 430 (e.g., individual registers are identified in FIG. 4 by lower case letters a, b, c, d, e and f) similar to the first register (buffer 430a). The registers may be arranged using a shift register architecture where a bit from the first register is provided as an input to a corresponding bit of the next register (i.e., the output of buffer 430a is connected to the input of buffer 430b), with this arrangement continuing down to the last register (i.e., buffer 430f). This shift register architecture allows the data in the first register to be shifted to the next register, and ultimately to the last register in delay table 440. By arranging delay table 440 this way, a first in, first out operation can be implemented such that a signal reconstruction circuit 450 only needs to consider the contents of the last register (i.e., buffer 430f) in determining the timing for reconstructing event signals. To assure that the last register (i.e., buffer 430f) always includes the next signal information, a shift controller circuit 477 causes data from the first register to bubble down to the unused register that is most proximate to the last register. To do this, after data is written to the first register (i.e., buffer 430a), it is determined if the next register (i.e., buffer 430b) is unused. An unused register may be determined using any number of mechanisms. For example, once the contents of the register are moved to another register, a portion of the now unused register is written indicating that the register is unused. Based on the disclosure provided herein, one of ordinary skill in the art will recognize a variety of approaches that may be used for identifying registers as unused. Where the next register (i.e., buffer 430b) is determined to be unused, the information from the first register (buffer 430a) is transferred to the next register, and the first register is marked as unused. The information in the recently written next register (i.e., buffer 430b) may be transferred to the next register (i.e., buffer 430c) in the sequence where that next buffer is unused. This process continues until the registers nearest to the last register are all used without any intervening unused registers, and only registers in sequence from the first register are unused. By doing this, flag write controller circuit 420 only needs to be connected to the first register (i.e., buffer 430a), and signal reconstruction circuit 450 only needs to be connected to the last register (i.e., buffer 430f). This limits the amount of routing resources required to implement the approach.

As mentioned, signal reconstruction circuit 450 is directly connected to the last register (i.e., buffer 430f) in delay table 440. Signal reconstruction circuit 450 uses the information available from the last register to determine when to reconstruct the signal represented by the information in the last register (buffer 430f). In some embodiments of the present invention, signal reconstruction circuit 450 is implemented similar to signal reconstruction circuit 350 described above in relation to FIG. 3. As such, signal reconstruction circuit 450 includes a length counter, a load controller circuit, a location counter, a flag type circuit, and a flag assertion circuit. Signal reconstruction circuit 450 asserts one or both of a defect flag 492 and a thermal affinity flag 494 at the appropriate time in the future and for the appropriate duration to reconstruct defect flag 402 and thermal affinity flag 404. As described above in relation to FIG. 3, defect flag 492 and thermal affinity flag 494 may be asserted relative to s start of codeword signal 461 or other reference to assure that the asserted event flag correspond to the same data as was indicated when the information relevant to the flag was originally written to buffer 430a.

Once the values from the last register (i.e., buffer 430f) in delay table 440 have been used by signal reconstruction circuit 450, the contents of the last register (i.e., buffer 430f) are transferred to the first register (i.e., buffer 460a) of a second stage delay table 470 under the control of shift controller circuit 477. In addition, the contents of all registers in first stage delay table 440 are shifted to the next register (i.e., the contents of buffer 430a are shifted to buffer 430b, the contents of buffer 430b are shifted to buffer 430c, ... and the contents of buffer 430e are shifted to buffer 430f) under the control of shift controller circuit 477. In this way, the last register in first stage delay table 440 includes information related to the next event flag that is to be reconstructed. By arranging first stage delay table 440 this way, routing requirements are limited as signal reconstruction circuit 450 is only ever concerned with the contents of the last register (buffer 430f).

Second stage delay table 440 includes a number of registers 460 (e.g., individual registers are identified in FIG. 4 by lower case letters a, b, c, d, e and f) similar to the first register (buffer 460a). The registers may be arranged using a shift register architecture where a bit from the first register is provided as an input to a corresponding bit of the next register (i.e., the output of buffer 460a is connected to the input of buffer 460b), with this arrangement continuing down to the last register (i.e., buffer 460f). This shift register architecture allows the data in the first register to be shifted to the next register, and ultimately to the last register in second stage delay table 470. By arranging second stage delay table 440 this way, a first in, first out operation can be implemented under the control of a shift controller circuit 479 such that a signal reconstruction circuit 480 only needs to consider the contents of the last register (i.e., buffer 460f) in determining the timing for reconstructing event signals. To assure that the last register (i.e., buffer 460f) always includes the next signal information, shift controller circuit 479 causes data from the first register to bubble down to the unused register that is most proximate to the last register. To do this, after data is written to the first register (i.e., buffer 460a), it is determined if the next register (i.e., buffer 460b) is unused. An unused register may be determined using any number of mechanisms. For example, once the contents of the register are moved to another register, a portion of the now unused register is written indicating that the register is unused. Based on the disclosure provided herein, one of ordinary skill in the art will recognize a variety of approaches that may be used for identifying registers as unused. Where the next register (i.e., buffer 460b) is determined to be unused, the information from the first register (buffer 460a) is transferred to the next register, and the first register is marked as unused. The information in the recently written next register (i.e., buffer 460b) may be transferred to the next register (i.e., buffer 460c) in the sequence where that next buffer is unused. This process continues until the registers nearest to the last register are all used without any intervening unused registers, and only registers in sequence from the first register are unused. By doing this, signal reconstruction circuit 480 only needs to be connected to the last register (i.e., buffer 460f). This limits the amount of routing resources required to implement the approach.

As mentioned, signal reconstruction circuit 480 is directly connected to the last register (i.e., buffer 460f) in second delay table 470. Signal reconstruction circuit 480 uses the information available from the last register to determine when to reconstruct the signal represented by the information in the last register (buffer 460f). In some embodiments of the present invention, signal reconstruction circuit 480 is implemented similar to signal reconstruction circuit 350 described above in relation to FIG. 3. As such, signal reconstruction circuit 480 includes a length counter, a load controller circuit, a location counter, a flag type circuit, and a flag assertion circuit. Signal reconstruction circuit 480 asserts one or both of a defect flag 496 and a thermal affinity flag 498 at the appropriate time in the future and for the appropriate duration to reconstruct defect flag 402 and thermal affinity flag 404. As described above in relation to FIG. 3, defect flag 496 and thermal affinity flag 498 may be asserted relative to a start of codeword signal 463 or other reference to assure that the asserted event flag correspond to the same data as was indicated when the information relevant to the flag was originally written to buffer 460a.

Once the values from the last register (i.e., buffer 460f) in second stage delay table 470 have been used by signal reconstruction circuit 480, the contents of the last register (i.e., buffer 460f) are transferred to a next stage if a next stage exists. In addition, the contents of all registers in second stage delay table 470 are shifted to the next register (i.e., the contents of buffer 460a are shifted to buffer 460b, the contents of buffer 460b are shifted to buffer 460c, ... and the contents of buffer 460e are shifted to buffer 460f). In this way, the last register in second stage delay table 470 includes information related to the next event flag that is to be reconstructed. By arranging first stage delay table 470 this way, routing requirements are limited as signal reconstruction circuit 480 is only ever concerned with the contents of the last register (buffer 460f).

Figure 4B:
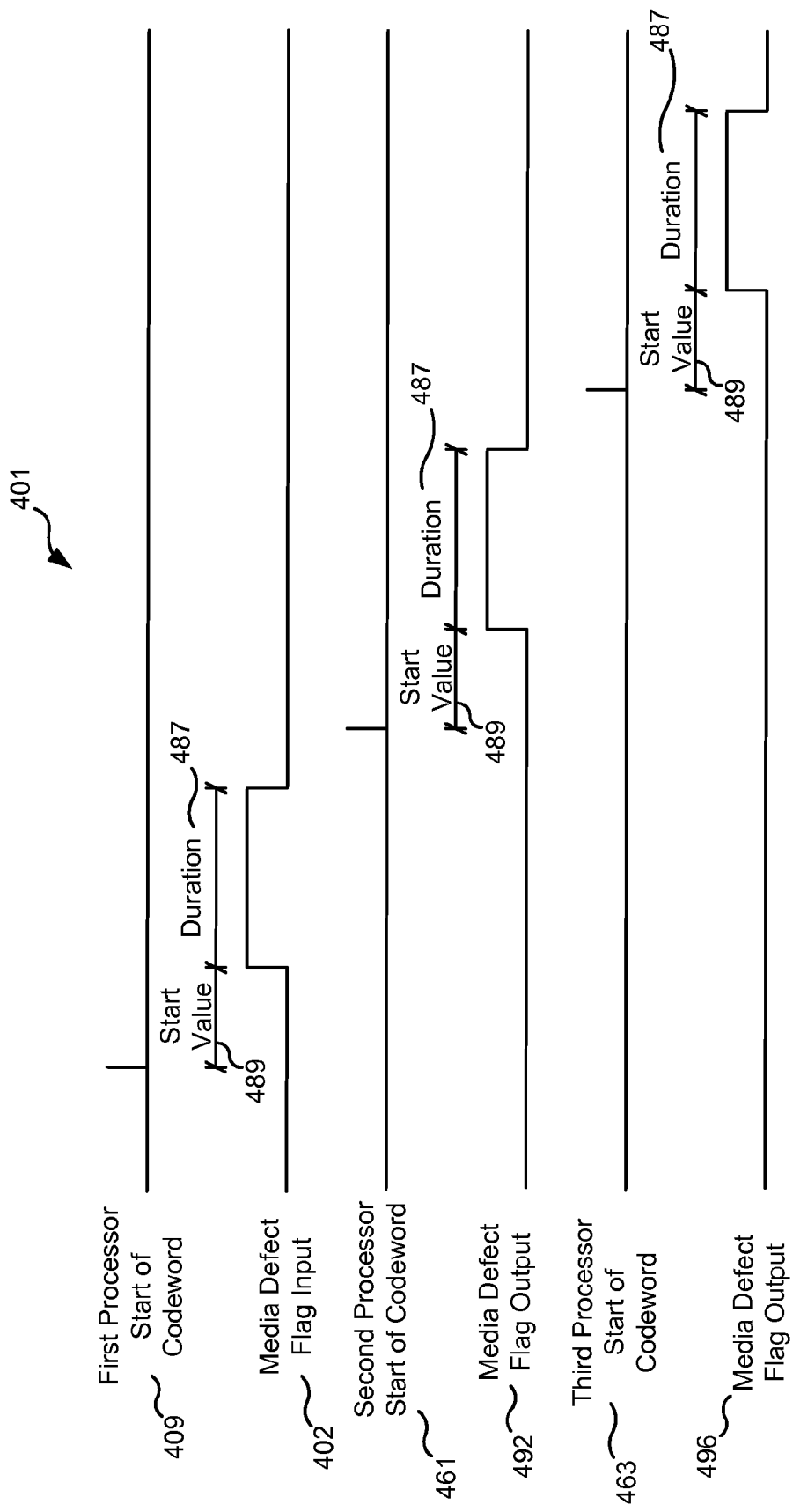

Turning to FIG. 4b, a timing diagram 401 depicts an exemplary operation of multiple event alignment control circuit 400 described above in relation to FIG. 4a. Following timing diagram 401, a start of codeword signal 309 available from a first processing stage is shown. When the start of codeword signal is asserted, the start value counter is reset and is subsequently incremented each bit period thereafter. Eventually, media defect flag 402 is asserted. The assertion begins a known number of clock cycles (start value 489) from en of codeword signal 409. Start value 489 is obtained from the start value counter. It should be noted that other reference signals may be used in place of start of codeword signal 409. Upon assertion of media defect flag 402, a duration counter begins incrementing to count the length of media defect flag 402. Upon de-assertion of media defect flag 402, the value on the duration counter is stored as a duration value 487. At this juncture, a complete information set about an event has been gathered and is stored in the first register (i.e., buffer 430*a*) of first stage delay table 440. The information in the first register is shifted to later registers in first stage delay table 440 such that there is are no unused registers between the last register (i.e., buffer 430*f*) in first stage delay table 440 and the register that holds the information about the most recent event. As signal reconstruction circuit 450 accesses information from the last register (i.e., buffer 430*f*) in first stage delay table 440, and progressively moves the information from earlier registers into the last register for use, the information for the most recently identified event flag is eventually moved into the last register (i.e., buffer 430*f*) where it is accessible to signal reconstruction circuit 450.

A start of codeword signal 461 available from a second processing stage is shown. This start of code word signal may be used to synchronize media defect flag input 402 provided to the first processing stage with the processing ongoing in the second processing stage. This synchronous point may be several thousand clock cycles later. By using the methods discussed herein for synchronizing event flags, an event flag may be moved into future by a large number of clock cycles without requiring that delay register have a number of register stages corresponding to the number of clock cycles. This results in a reduction in power and gates expended in synchronizing event flags between successive processing circuits. Based upon the disclosure provided herein, one of ordinary skill in the art will recognize a variety of other advantages that may be had through implementation of different embodiments of the present invention.

Upon assertion of start of codeword signal 461 from the second stage processor, a location counter is reset and is incremented for each successive bit period thereafter. When the count value obtained from the location counter is equivalent to start value 489, media defect flag 492 is asserted. The assertion of media defect flag 492 occurs the same distance from start of codeword signal 461 as media defect flag 402 occurs from start of codeword signal 409. Thus, the assertion point of media defect flag 492 is reconstructed to represent media defect flag 402 shifted forward a number of clock cycles. At the same time that media defect flag 492 is asserted, a length counter is loaded with duration value 487. The length counter is decremented on each successive bit period, and as the length value transitions to zero, media defect flag 492 is de-asserted. In this way, the length between the de-assertion point of media defect flag 492 and the assertion point of media defect flag 492 is the same as the length between the de-assertion point of media defect flag 402 and the assertion point of media defect flag 402. Once media defect flag 492 is de-asserted, the information in the last register (buffer 430*f*) of first stage delay table 440 is replaced by the next register, and all other registers are moved down in preparation for reconstruction of the next event flag.

In addition, the information in the last register (i.e., buffer 430*f*) is transferred to the first register (i.e., buffer 460*a*). The information in the first register (i.e., buffer 460*a*) is shifted to later registers in second stage delay table 470 such that there is are no unused registers between the last register (i.e., buffer 460*f*) in second stage delay table 470 and the register that holds the information about the most recent event. As signal reconstruction circuit 480 accesses information from the last register (i.e., buffer 460*f*) in second stage delay table 470, and progressively moves the information from earlier registers into the last register for use, the information for the most recently identified event flag is eventually moved into the last register (i.e., buffer 460*f*) where it is accessible to signal reconstruction circuit 480.

Upon assertion of start of codeword signal 463 from the third stage processor, a location counter is reset and is incremented for each successive bit period thereafter. When the count value obtained from the location counter is equivalent to start value 489, media defect flag 496 is asserted. The assertion of media defect flag 496 occurs the same distance from start of codeword signal 463 as media defect flag 402 occurs from start of codeword signal 409. Thus, the assertion point of media defect flag 496 is reconstructed to represent media defect flag 402 shifted forward a number of clock cycles. At the same time that media defect flag 496 is asserted, a length counter is loaded with duration value 487. The length counter is decremented on each successive bit period, and as the length value transitions to zero, media defect flag 496 is de-asserted. In this way, the length between the de-assertion point of media defect flag 496 and the assertion point of media defect flag 496 is the same as the length between the de-assertion point of media defect flag 402 and the assertion point of media defect flag 402. Once media defect flag 496 is de-asserted, the information in the last register (buffer 460*f*) of second stage delay table 470 is replaced by the next register, and all other registers are moved down in preparation for reconstruction of the next event flag.

Figure 5A:
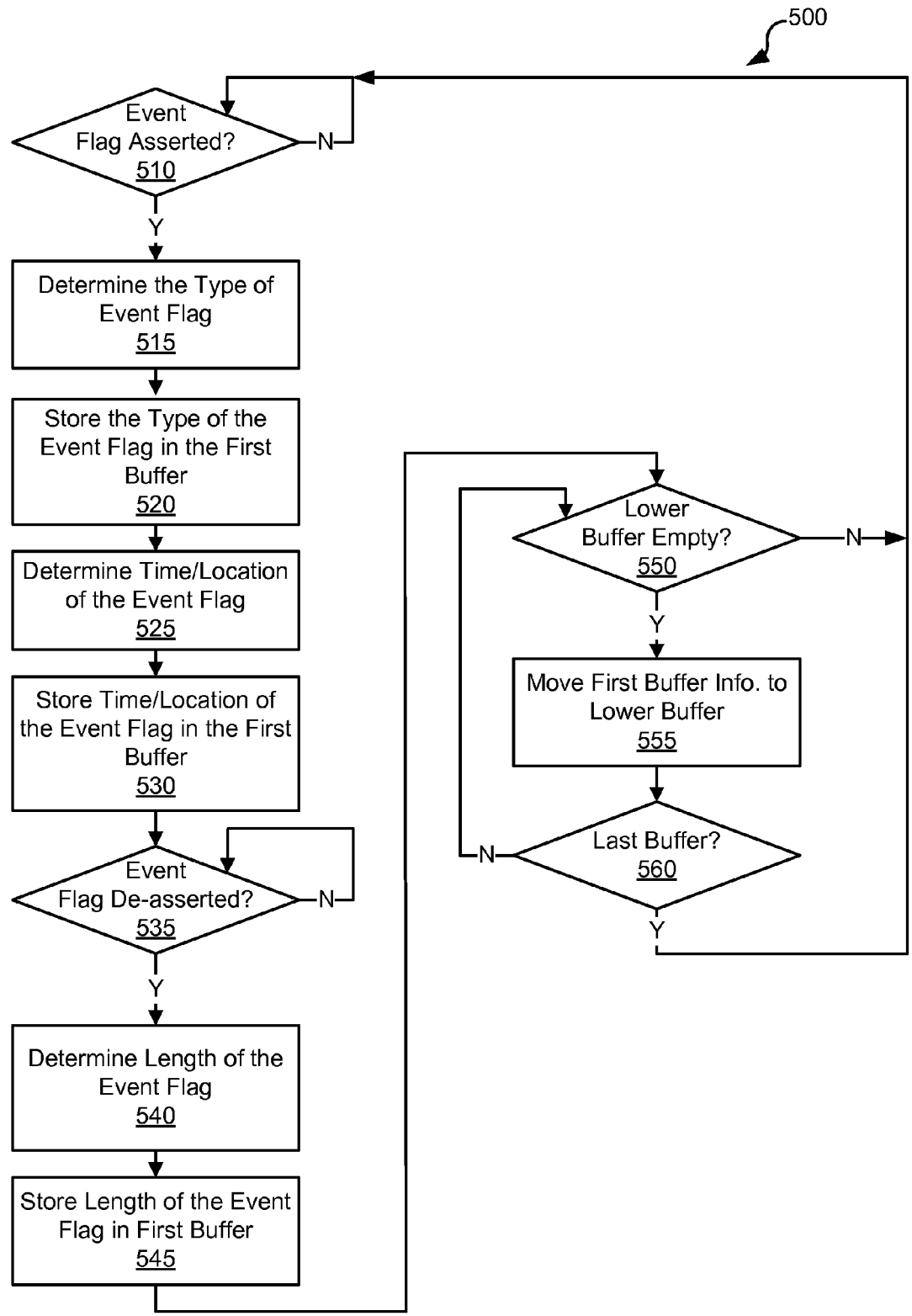
FIG. 5a is a flow diagram showing a method in accordance with some embodiments of the present invention for marking and loading a detected event.

Turning to FIG. 5*a*, a flow diagram 500 shows a method in accordance with some embodiments of the present invention for marking and loading a detected event. Following flow diagram 500, it is determined whether an event flag is asserted (block 510). The event flag may be any event flag known in the art including, but not limited to, a media defect flag or a thermal affinity flag. Based upon the disclosure provided herein, one of ordinary skill in the art will recognize a variety of event flags that may be used in relation to different embodiments of the present invention. Where an event flag is asserted (block 510), it is determined what type of event flag has been asserted (block 515), and the identified event flag type is stored in the first register or buffer of a delay table (block 520). In addition, it is determined when relative to a particular signal that the event flag was asserted (block 525), and the determined relative starting point is stored to the first register or buffer of a delay table (block 530).

The de-assertion of the event flag is then awaited (block 535). Once the event flag is de-asserted (block 535), the length or duration of the asserted event flag is determined (block 540), and the determined length or duration is stored to the first register or buffer (block 545). With this done, a complete set of information about the event flag is available. This set of information is then transferred to the unused buffer or register most proximate to the last register in the delay table. This is done by determining whether the next buffer closer to the last register or buffer is empty (block 550). Where the next buffer is empty (block 550), the information from the preceding buffer is moved to the next buffer, and the preceding buffer is modified to indicate it is empty (block 550). It is then determined whether the buffer into which the data was written is the last buffer in the delay table (block 560). Where it is determined that the buffer is the last buffer (block 560) or that a lower buffer is not empty (block 550), the process of identifying and loading an event flag is completed.

Figure 5B:
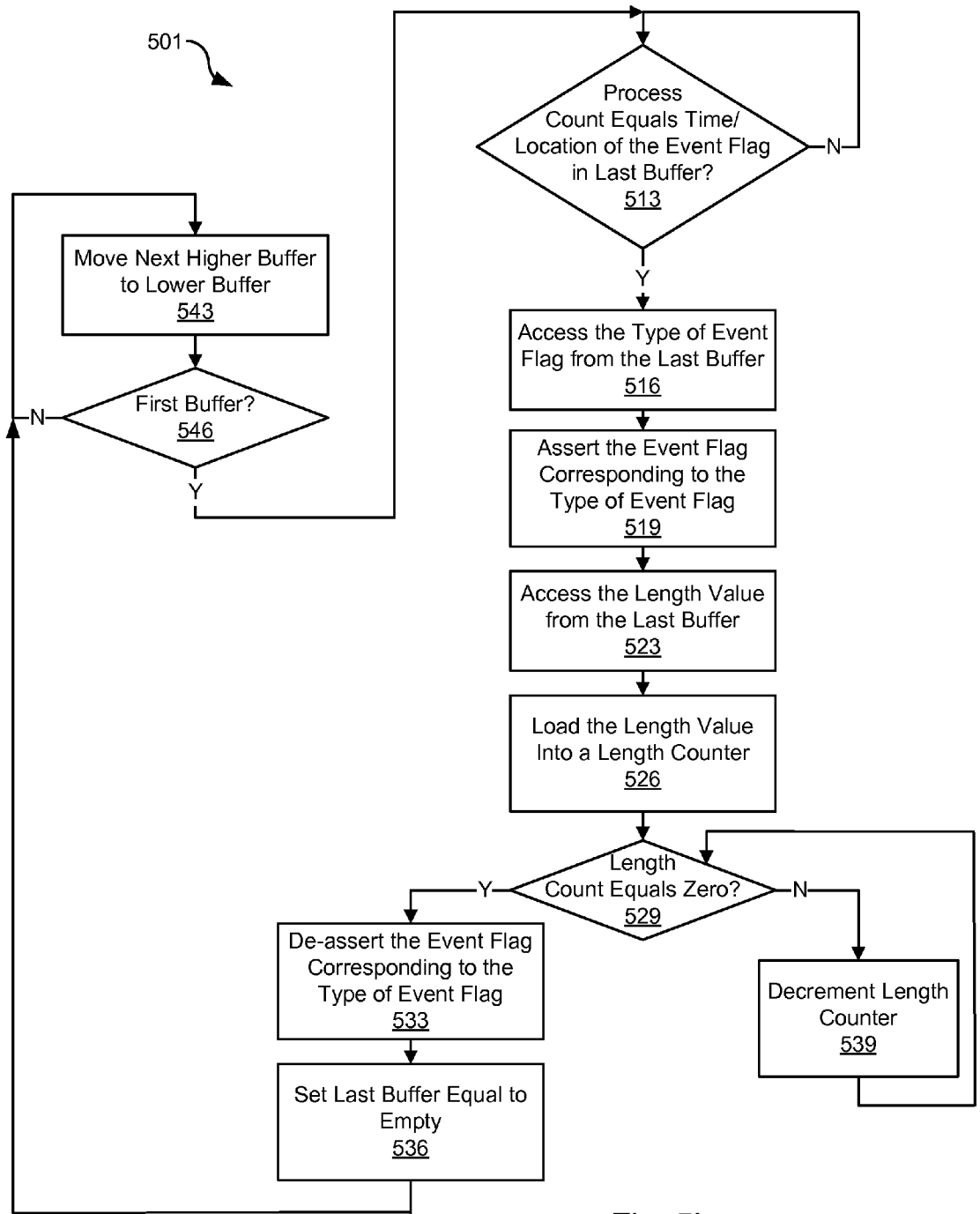
FIG. 5b is a flow diagram showing a method in accordance with some embodiments of the present invention for accessing and aligning a previously marked event.

Turning to FIG. 5*b*, a flow diagram 501 shows a method in accordance with some embodiments of the present invention for accessing and aligning a previously marked event. Following flow diagram 501, it is determined whether the current location relative to a recurring location mark is equivalent to the location of the event flag as identified in the last buffer of the delay table (block 513). Where the equivalence is identified, the type of event flag is accessed from the last buffer of the delay table (block 516), and the identified event flag is asserted (block 519). A length value from the last buffer of the delay table is accessed (block 523), and the accessed length value is loaded into a length counter (block 526). It is determined whether the length counter has decremented to zero (block 529). Where the length count is not equal to zero (block 529), the length counter is decremented (block 539).

Alternatively, where the length count is equal to zero (block 529), the event flag is de-asserted (block 533) and the last buffer in the delay table is set or modified to indicate it is empty (block 536). The information in the delay table is then shifted down to fill the last buffer. In particular, the information from the next higher buffer is transferred to the last buffer (block 543). It is then determined whether the next higher buffer is the first buffer in the delay table (block 546). Where it is not the first buffer (block 546), the information in the next higher buffer is transferred to the lower buffer (e.g., information from the buffer three places above the last buffer is transferred to the buffer two places above the last buffer). Once this is complete, the last buffer includes the next event flag to be reconstructed, and all of the used buffers in the delay table are contiguous.

Figure 6:
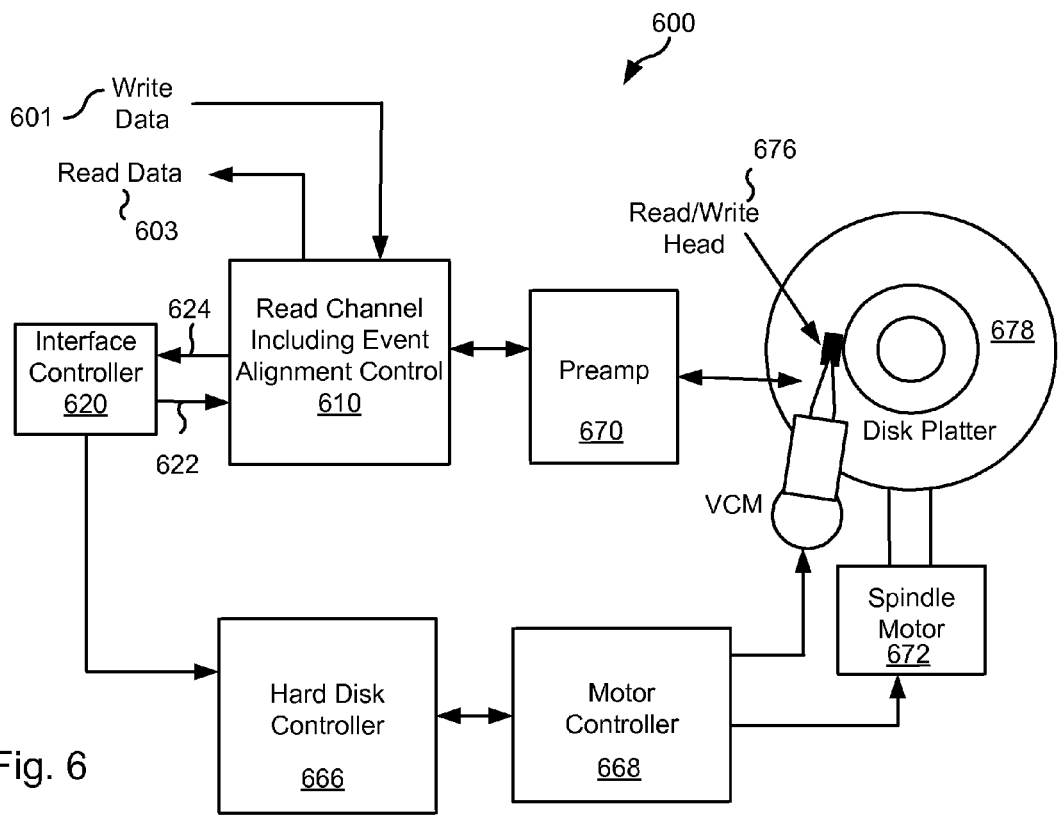
FIG. 6 shows a storage device including event alignment control in accordance with various embodiments of the present invention.

Turning to FIG. 6, a storage system 600 including read channel 610 with event alignment control is shown in accordance with various embodiments of the present invention. Storage system 600 may be, for example, a hard disk drive. Read channel 610 may include, but is not limited to, a processing circuit including event alignment control such as that described above in relation to FIGS. 1-4, and/or may include event alignment done in accordance with the methods described in relation to FIGS. 5a-5b above.

Storage system 600 also includes a preamplifier 670, an interface controller 620, a hard disk controller 666, a motor controller 668, a spindle motor 672, a disk platter 678, and a read/write head assembly 676. Interface controller 620 controls addressing and timing of data to/from disk platter 678. The data on disk platter 678 consists of groups of magnetic signals that may be detected by read/write head assembly 676 when the assembly is properly positioned over disk platter 678. In one embodiment, disk platter 678 includes magnetic signals recorded in accordance with a perpendicular recording scheme. For example, the magnetic signals may be recorded as either longitudinal or perpendicular recorded signals.

In a typical read operation, read/write head assembly 676 is accurately positioned by motor controller 668 over a desired data track on disk platter 678. The appropriate data track is defined by an address received via interface controller 620. Motor controller 668 both positions read/write head assembly 676 in relation to disk platter 678 and drives spindle motor 672 by moving read/write head assembly to the proper data track on disk platter 678 under the direction of hard disk controller 666. Spindle motor 672 spins disk platter 678 at a determined spin rate (RPMs). Once read/write head assembly 678 is positioned adjacent the proper data track, magnetic signals representing data on disk platter 678 are sensed by read/write head assembly 676 as disk platter 678 is rotated by spindle motor 672. The sensed magnetic signals are provided as a continuous, minute analog signal representative of the magnetic data on disk platter 678. This minute analog signal is transferred from read/write head assembly 676 to read channel 610 via preamplifier 670. Preamplifier 670 is operable to amplify the minute analog signals accessed from disk platter 678. In turn, read channel module 610 decodes and digitizes the received analog signal to recreate the information originally written to disk platter 678. The decoding process includes event alignment control which, in some cases, may provide control over future processes based upon earlier detected events. The read data is provided as read data 603. A write operation is substantially the opposite of the preceding read operation with write data 601 being provided to read channel module 610. This data is then encoded and written to disk platter 678.

In conclusion, the invention provides novel systems, devices, methods and arrangements for event alignment control. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An event alignment control circuit, the circuit comprising:
   a delay table, wherein the delay table includes at least a first register and a last register, and wherein the delay table is operable to transfer data from the first register to the last register;
   a flag write controller circuit, wherein the flag write controller circuit is operable to receive an indication of assertion of an event flag and to write information relevant to the event flag to the first register of the delay table;
   a signal reconstruction circuit, wherein the signal reconstruction circuit is electrically coupled to the last register, and wherein the signal reconstruction circuit is operable to reconstruct the event flag based at least in part on the information relevant to the event flag from the last register;
   a first processing circuit operable to process a first input derived from a data set based at least in part on the event flag, wherein the event flag is not part of the data set, and wherein the event flag is relevant to a defined portion of the first input; and
   a second processing circuit operable to process a second input derived from the data set based at least in part on the reconstructed event flag, wherein the reconstructed event flag is relevant to a defined portion of the second input.

2. The circuit of claim 1, wherein the first register and the last register are arranged in a shift register architecture with an output of the first register being applied to a second register, and the output of the second register ultimately being applied to the last register.

3. The circuit of claim 2, wherein the delay table includes a shift controller circuit operable to shift information from the first register toward the last register such that no unused register remains between the register that receives the information derived from the first register and the last register.

4. The circuit of claim 1, wherein the event flag is a media defect flag.

5. The circuit of claim 1, wherein the event flag is a thermal affinity flag.

6. The circuit of claim 1, wherein the first processing circuit includes a first data detector circuit, wherein the second processing circuit includes a second data detector circuit, and wherein the data processed by the second processing circuit is derived from an output of the first processing circuit.

7. The circuit of claim 1, wherein the first processing circuit includes a data detector circuit, wherein the second processing circuit includes a data decoder circuit, and wherein the data processed by the decoder circuit is derived from an output of the data detector circuit.

8. The circuit of claim 1, wherein the information relevant to the event flag includes:
- a start value, wherein the start value indicates a location of the event flag relevant to a particular occurrence; and
- a length value, wherein the length value indicates a period of time that the event flag is asserted.

9. The circuit of claim 8, wherein the particular occurrence is a start of codeword indicator signal.

10. The circuit of claim 1, wherein the circuit is implemented as part of a storage device.

11. A method for aligning events across multiple processes, the method comprising:
- providing a delay table, wherein the delay table includes a first register and a last register;
- receiving an event flag indicating an event related to a data set;
- identifying information relevant to the event flag;
- writing the information relevant to the event flag to the first register of the delay table;
- processing the data set based at least in part on the event flag to yield an output;
- shifting the information relevant to the event flag from the first register to the last register;
- accessing the information relevant to the event flag;
- processing the output based at least in part on the event flag to yield an output;
- based at least in part on the information relevant to the event flag, reconstructing the event flag to provide a reconstructed flag at a defined point in the future; and
- processing the output based at least in part on the reconstructed flag.

12. The method of claim 11, wherein the information relevant to the event flag includes:
- a start value, wherein the start value indicates a location of the event flag relevant to a particular occurrence; and
- a length value, wherein the length value indicates a period of time that the event flag is asserted.

13. The method of claim 12, wherein the particular occurrence is a start of codeword indicator signal.

14. The method of claim 11, wherein the first register and the last register are arranged in a shift register architecture with an output of the first register being applied to a second register, and the output of the second register ultimately being applied to the last register via one or more intervening registers.

15. The method of claim 14, wherein shifting the information relevant to the event flag from the first register to the last register is done under the direction of a shift controller circuit, and wherein shifting the information relevant to the event flag from the first register to the last register includes shifting the information relevant to the event flag to one of the one or more intervening registers such that no unused registers exist between the intervening register maintaining the information relevant to the event flag and the last register.

16. The method of claim 11, wherein the event flag is selected from a group consisting of a media defect flag and a thermal affinity flag.

17. The method of claim 11, wherein the first processing circuit includes a first data detector circuit, and wherein the second processing circuit includes a second data detector circuit.

18. The method of claim 11, wherein the first processing circuit includes a data detector circuit, and wherein the second processing circuit includes a data decoder circuit.

19. A data processing system, the data processing system comprising:
- an event detector circuit operable to identify an event related to a data set;
- a delay memory including at least a first memory and a second memory, and wherein the delay memory is operable to transfer information relevant to the event from the first memory to the second memory;
- a signal reconstruction circuit operable to reconstruct the information relevant to the event based at least in part upon information obtained from the second memory to yield a reconstructed event;
- a first processing circuit operable to process the data set to yield an output, and wherein the event flag is relevant to a defined portion of the data set as processed by the first processing circuit; and
- a second processing circuit operable to process the output, wherein the reconstructed event is relevant to a defined portion of the data set as processed by the second processing circuit.

20. The data processing system of claim 19, wherein the data processing system is incorporated in an integrated circuit.

21. The data processing system of claim 19, wherein the data processing system is implemented as part of a storage device.

22. The data processing system of claim 19, wherein the event detector circuit is a media defect detector circuit, and wherein the event is a media defect corresponding to a location on a storage medium from which a portion of the data set is derived.

23. The data processing system of claim 19, wherein processing applied to the data set by the first processing circuit is based at least in part on the event flag.

24. The data processing system of claim 23, wherein processing applied to the output by the second processing circuit is based at least in part on the reconstructed event.

* * * * *